Figure 1:
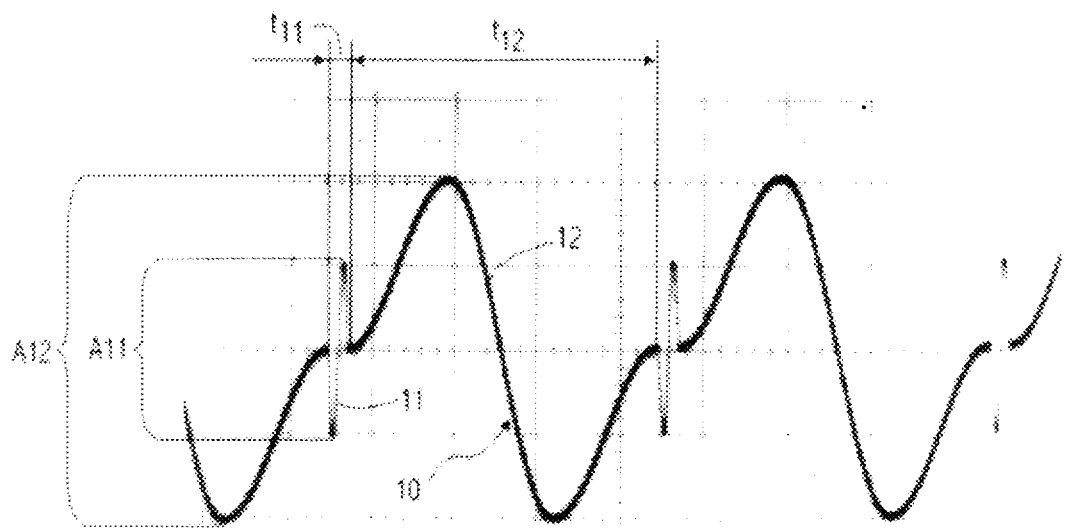

United States Patent [19]
Rey et al.

[11] Patent Number: 5,781,176
[45] Date of Patent: Jul. 14, 1998

[54] IMAGE QUALITY IMPROVEMENT ON RASTER DISPLAY

[75] Inventors: William J. J. Rey; Maarten Vertregt, both of Eindhoven, Netherlands

[73] Assignee: U.S. Phillips Corporation, New York, N.Y.

[21] Appl. No.: 643,069

[22] Filed: Apr. 30, 1996

[30] Foreign Application Priority Data

May 23, 1995 [EP] European Pat. Off. ............ 95201342

[51] Int. Cl.$^6$ .................................................. G09G 1/28
[52] U.S. Cl. ................... 345/147; 345/136; 345/138; 358/455; 382/266; 395/126; 395/132; 395/141
[58] Field of Search .................... 345/112, 133, 345/136, 138, 147; 358/455, 456; 382/260–269; 395/126, 128, 132, 140–143

[56] References Cited

U.S. PATENT DOCUMENTS

| | | | |
|---|---|---|---|
| 4,908,780 | 3/1990 | Priem et al. | 364/521 |
| 5,063,375 | 11/1991 | Lien et al. | 340/703 |
| 5,235,435 | 8/1993 | Schiller | 358/456 |
| 5,347,618 | 9/1994 | Akeley | 395/121 |
| 5,438,656 | 8/1995 | Valdes et al. | 395/143 |
| 5,461,703 | 10/1995 | Goyins et al. | 395/109 |
| 5,515,456 | 5/1996 | Ballard | 382/252 |
| 5,565,886 | 10/1996 | Gibson | 345/136 |
| 5,590,255 | 12/1996 | Takeshima et al. | 395/141 |

FOREIGN PATENT DOCUMENTS 2214765  9/1989  United Kingdom ............ G09G 1/14

*Primary Examiner*—Kee M. Tung
*Assistant Examiner*—Vincent E. Kovalick
*Attorney, Agent, or Firm*—Anne E. Barschall

[57] ABSTRACT

A structure with fine details, such as a periodic signal, is displayed on a raster display. To avoid aliasing due to an interference between the details and the columns and row pattern of the raster display each of the points representing the structure to be displayed is allocated to pixels in adjacent columns and/or rows. Allocation occurs by means of a stochastic procedure in which the probability to allocate a point to a pixel is dependent on the position of the point with respect to the pixel. Accumulated pixel-values are converted into a limited number of grey-values by means of an additional procedure that allows for fixed proportions of the pixels to have the same grey-value.

11 Claims, 8 Drawing Sheets

IMAGE QUALITY IMPROVEMENT ON RASTER DISPLAY

The invention relates to a method for displaying on a raster display a plurality of points, each described by a pair of coordinates, said raster display comprising a pixel-matrix of a number of rows and a number of columns, in which method for each pixel a respective grey-value is determined that is derived from the position of the points relative to the pixel.

The invention also relates to a display device having a display comprising a raster with a pixel-matrix of a number of rows and a number of columns.

A raster display comprises a two dimensional array or matrix of picture elements (pixels), to each of which can be assigned a grey-value. A typical display has several hundreds of lines and columns. Each pixel, therefore, occupies only a minor fraction of the display surface and the observer sees an image without perceiving, normally, the individual pixels. A line or an area on a raster display is presented by providing a different colour or grey-value for virtually all pixels that are traversed by the line or that are covered, completely or partially, by the area.

If the line or shape to be displayed represents a physical entity, for example a structure with small details or a signal value as a function of time, sampling of the entity is performed to determine a two-dimensional array of points having positions and signal values (pairs of coordinates). This array of coordinate pairs can be displayed by providing a different colour or grey-value for those pixels in which a coordinate pair is located. Such a method provides an acceptable approximation of the signal to be displayed if the difference in position and the difference in signal value between subsequent pairs of the array does not exceed an amount corresponding the interval between adjacent pixels in a row or column. If for each column one point is present and the difference in signal value between subsequent points is not larger than the difference of adjacent lines the observer will perceive a curve that is a good approximation of the signal. Before displaying the structure, a proper transformation of the coordinates of the points to the frame of reference of the pixel-matrix is necessary. Here and in the whole of the present document, in comparing the positions and distances of a structure or signal to be displayed with dimensions of the raster display it is assumed that a suitable transformation into a common frame of reference is performed.

A problem that arises when a structure is displayed on a raster display is so-called aliasing, i.e. interference between the displayed structure and the raster. If the frequency of the structure is significantly less than the frequency of the raster, aliasing manifests itself as staircase artefacts in sloped lines. If the frequency of the structure is roughly equal to or above the raster frequency a moire-like beat pattern occurs. Such beat pattern is caused by interference between periodicities of the raster display and the (periodic) structure in the displayed entity.

A method and device as indicated in the introductory paragraph is known from GB-A-2 214 765. In this document a method is disclosed for displaying an array of points of which subsequent points have a difference in one coordinate that exceeds significantly the distance between adjacent pixels. According to this known method, vectors are calculated between subsequent points and to each pixel having a centre point bounding a vector trajectory a grey-value is assigned that is dependent on the distance between the pixel centre and the vector trajectory. With the known method a display of the array of points is obtained in which gaps are absent and in which a tilted line is displayed without sudden jumps that otherwise would be caused by the discrete nature of the raster display. In case more than one vector is close enough to a pixel to contribute an additional increase in grey20 value occurs.

By applying this known method, aliasing in structures that are coarse with respect to the display raster is largely eliminated. The moire-like pattern in fine structures is reduced but not eliminated. The known method does not provide a satisfactory image if the observer is interested not in the accurate shape of a waveform of a signal but wants a more global view of, for example, a rapidly changing signal comprising several components. In such a situation the details of the structure have a higher resolution than what corresponds to the distance between adjacent columns or rows of the raster display. Sampling in such circumstances a signal with a rapidly changing value with a distance between subsequent samples of points that is equal (or larger) than the corresponding distance between columns in the raster display leads almost certainly to a more or less random distribution of the points. On the other hand, sampling with a frequency that is much higher leads to a situation that each pixel receives contributions from a large number of points and consequently, to a maximum grey-value or intensity of a large area of the raster display so that no information about the distribution of the points is available to the observer. A similar problem occurs in other situations where the details of the structure to be displayed can only be represented by sets of coordinate pairs that have distances between each other that are smaller than the distances between the centres of the pixels in the raster display.

An additional problem that can arise in a display method such as described in GB-A-2 214 765 is that the grey-values of the pixels cover a wide range. In particular, when many points contribute to a same pixel, the grey-value of such pixels will be large. When only a single point contributes to a pixel, the resulting grey-value is likely to be low. This means that by such a procedure the resulting grey-values will cover a large dynamic range. This in turn may cause that a large fraction of the pixels is hardly visible to the observer, because the intensity distribution of the image on the display is dominated by the (few) pixels with the largest grey-value and most of the other pixels will have an intensity that is low or very low.

It is, inter alia, an object of the invention to provide a method by means of which an array of points representing a structure of which the internal details have a size that is comparable to or higher than the distance between columns and rows of the raster display, can be displayed such that the global outline and the internal intensity distribution of the structure can still be perceived by the observer. It is a further object of the invention to provide a method in which the dynamic range can be reduced while maintaining the global information in the displayed image.

To this end, the method according to the invention is characterised in that the array is displayed on such a scale that several points may fall within the same pixel; that for each pixel a pixel-value is calculated from contributions of the points by first determining on basis of the coordinates of each point a sub-set of the pixels and subsequently adding an amount to the pixel-value of one or more pixels from said sub-set in accordance with a stochastic procedure; and that the respective grey-values are derived from the calculated pixel-values.

For each column and/or row of the raster display a number of points is obtained by sampling with a high sampling rate, interpolation between samples with a lower sampling rate or otherwise. Each point has only a partial contribution to the total pixel-value of the pixels in the sub-set of neighbouring pixels to which it is assigned by virtue of its coordinates. Due to the stochastic allocation procedure, each point has a certain probability to contribute to each of the pixels in the sub-set. Because of the large number of points, the result is that the contribution of a point is apparently smeared out over the pixels in the subset, effectively removing any moire-pattern. In addition, by allocation of a point to a pixel in a stochastic way, the dynamic range of resulting pixel-values is reduced.

An embodiment of the method according to the invention is characterised in that the amount with which a point adds to a pixel-value is selected from a set of predetermined amounts. By using a few discrete values for a contribution of a point to a pixel-value, the dynamic range is further reduced and a simple implementation and fast execution of the method is possible.

This embodiment of the method according can be further characterised in that in said stochastic procedure a probability is determined for selecting an amount from said set of predetermined amounts, said probability being derived from the difference between the point's coordinates and the position of the pixel in the pixel-matrix after transformation into a common frame of reference. With this measure, points that are close to a reference position within a pixel have a larger chance to contribute than points further away. The reference position is, for example, the centre or the left hand edge of the column or lower edge of the row. By using a contribution of a point to a pixel value which is weighted in the described way, the moire- or beat pattern which would often otherwise occur is suppressed.

A preferred embodiment of the invention is characterised in that for each point the set of predetermined amounts comprises two values being zero and a full amount value, the latter being a function of said point. A set of amounts having only two values, zero or maximum, provides satisfactory results and is the most simple to implement. The full amount value can be one but it may be different for different classes of points, for example dependent on the derivative of a curve to be displayed or on the way points between samples are interpolated.

In the presentation of pixel-values on the raster display, an embodiment of the invention is characterised in that the number of different grey-values is limited, that to each pixel a grey-value is assigned on basis of the determined pixel-value and that each of said grey-values is assigned in an approximately constant fraction of the pixel-values in a stream of pixel-values building up the pixel-matrix. Pixels are displayed, and if necessary updated, one after the other. In this stream of pixels it is possible to assign a grey-value for a given sub-range of pixel-values. In this embodiment the sub-ranges are chosen, and adapted if so required, such that each grey-value is used for a constant, predetermined, fraction of the pixel-values in the stream. This can be implemented, for example, in that the reassignment is made dependent on the number of different grey-values that has already occurred and the pixel-value ranges are adapted. For obtaining an adequate impression of a structure, only a limited number of different grey values needs to be made visible on the display. Changing the relative proportions of the predetermined fractions is equivalent to a change in brightness and contrast on a continuous scale of grey-values. It appears that a distribution in which the different fractions of pixels having a pixel-value different from zero are equal is perceived as a proper mode of display.

An additional advantage of re-assignment to a limited number of grey-values is that only a few bits per pixel are necessary for data transfer or storage. It appears that only four grey-values can be sufficient for an adequate global representation of a fine structure. This corresponds to two bits per pixel and is therefore advantageous in terms of use of memory and other resources.

An advantageous application is the display of periodic signals such as time dependent voltages or currents. The invention provides a method to display a large number of periods of such signal on a raster display, such that the image perceived by an observer is similar to the intensity distribution that would occur if the signal is displayed on an analogue display. Without the use of the present invention the raster display would often show aliasing in the form of a beat pattern and the signal would not be recognizable.

These and other, more detailed, aspects of the invention will be illustrated, by way of example, with reference to the drawing in the detailed description of the embodiments.

The drawing shows in

Figure 2:
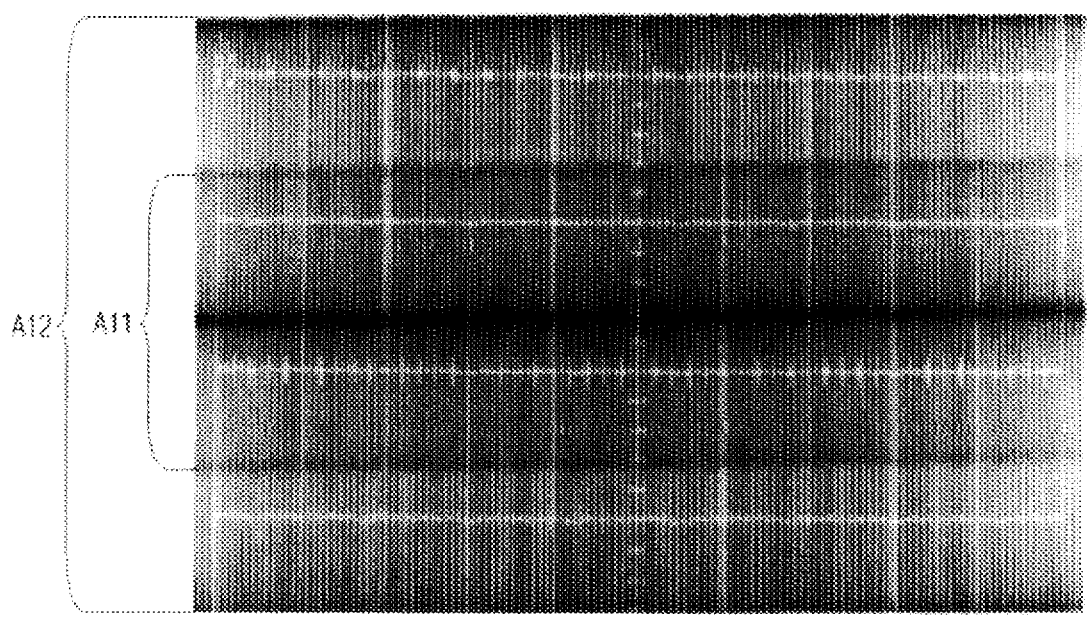
Figure 3:
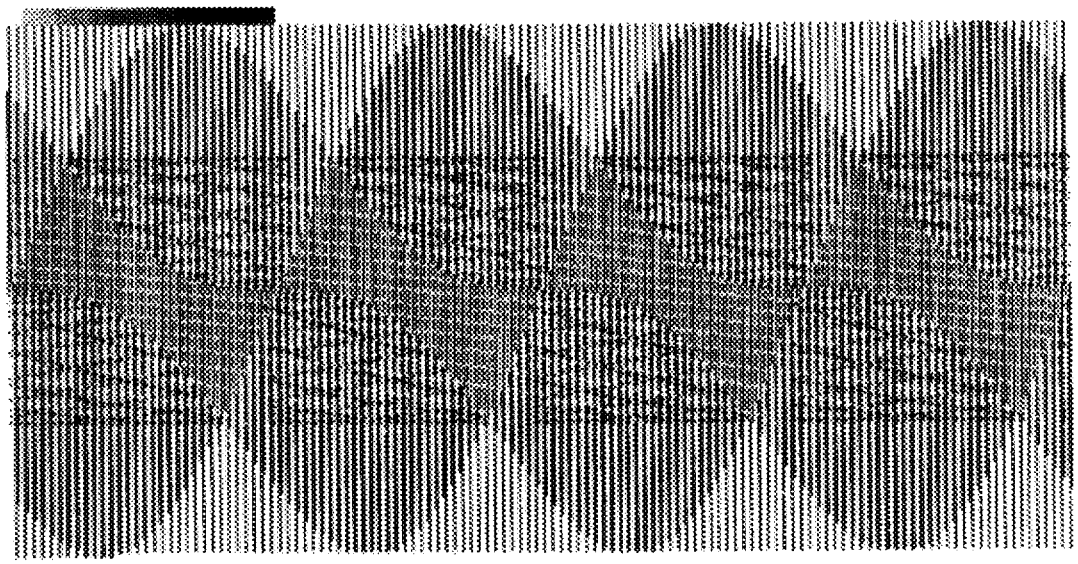
Figure 4:
Figure 5A:
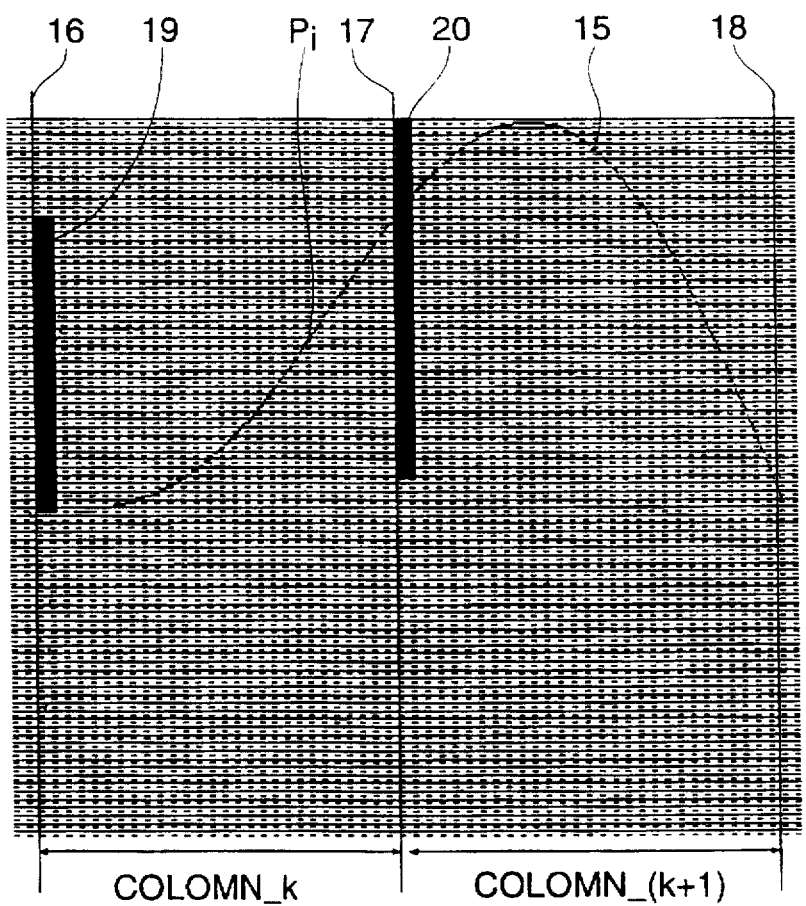
Figure 5B:
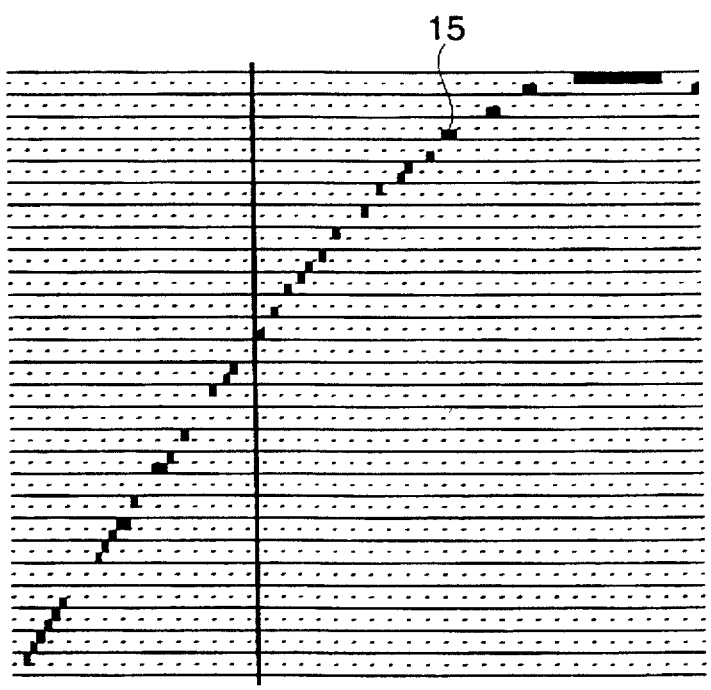
Figure 6:
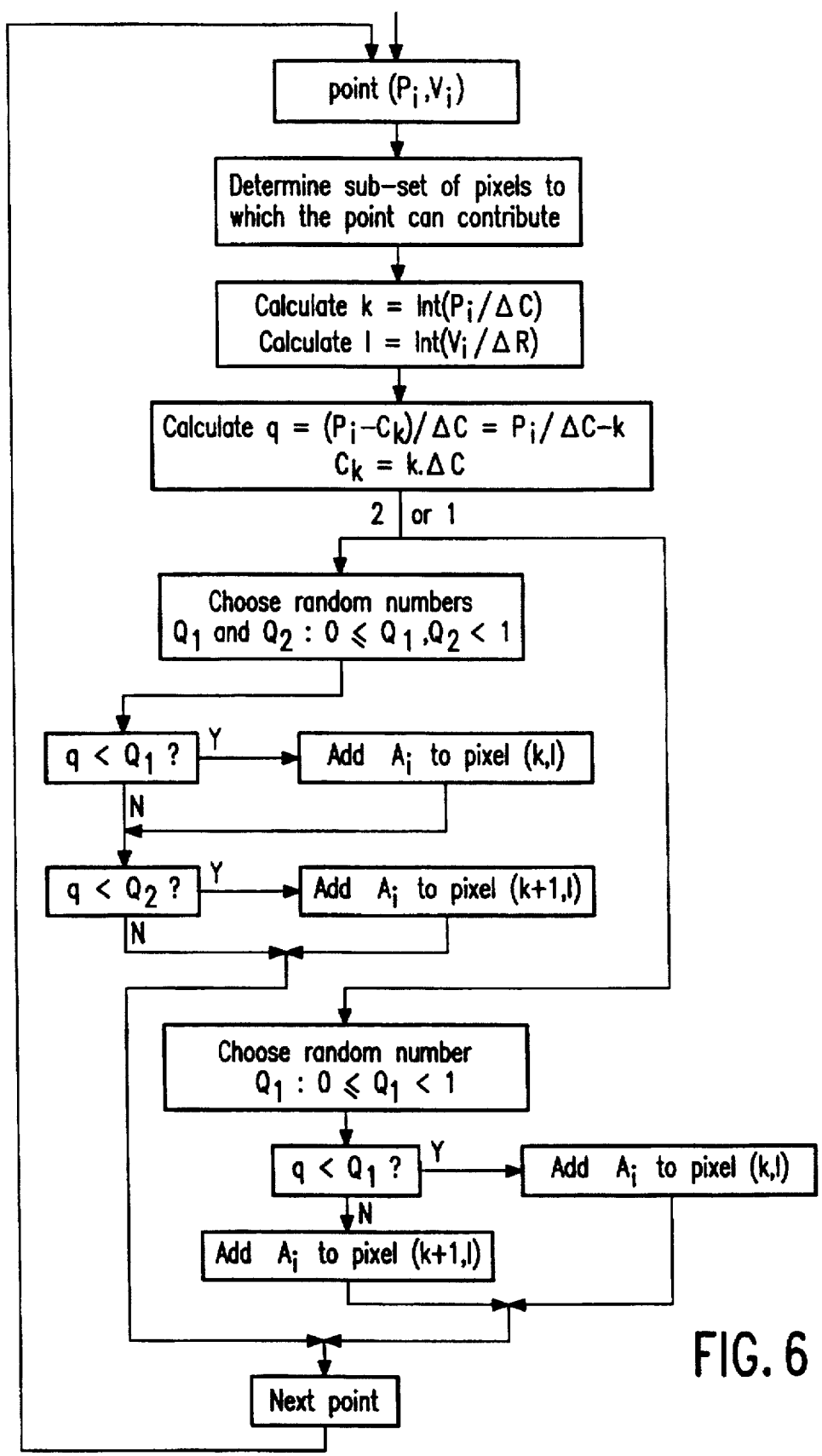
Figure 7:
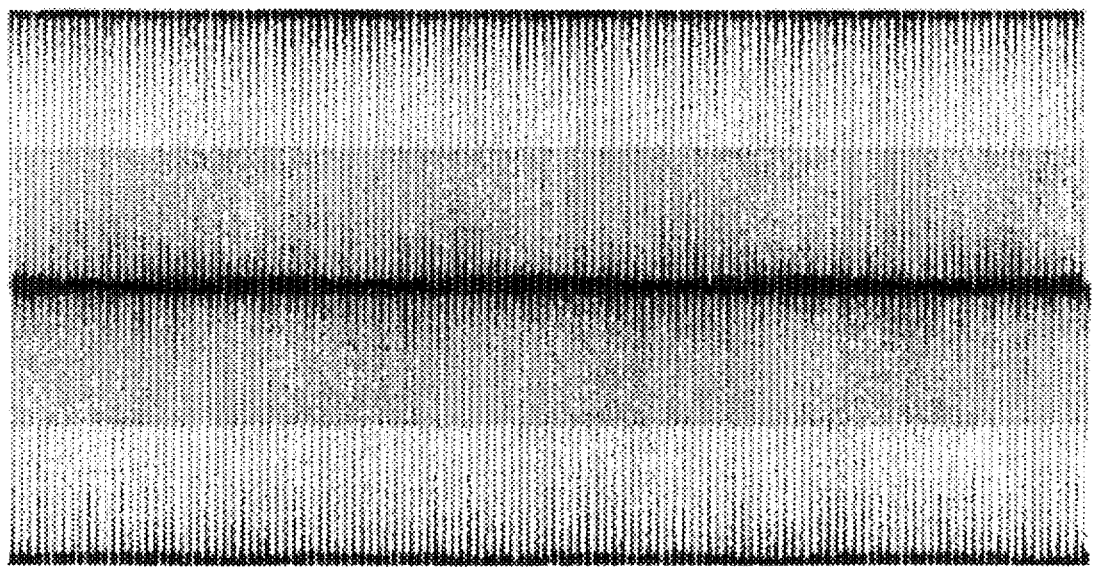
Figure 8A:
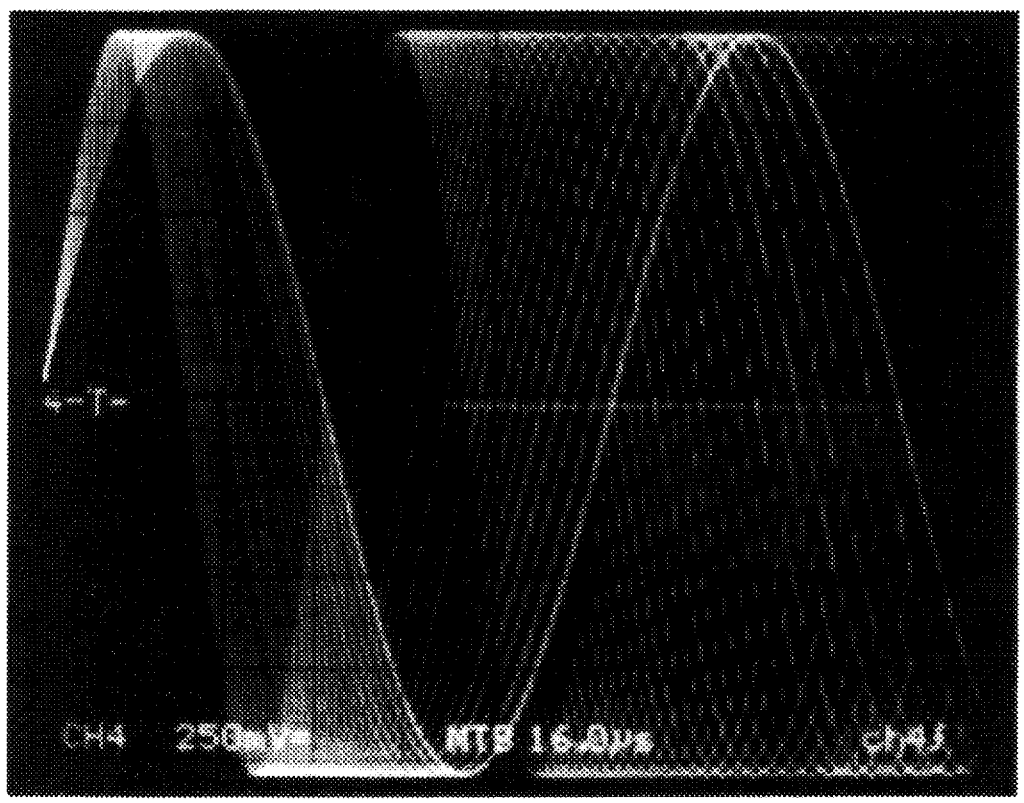
Figure 8B:
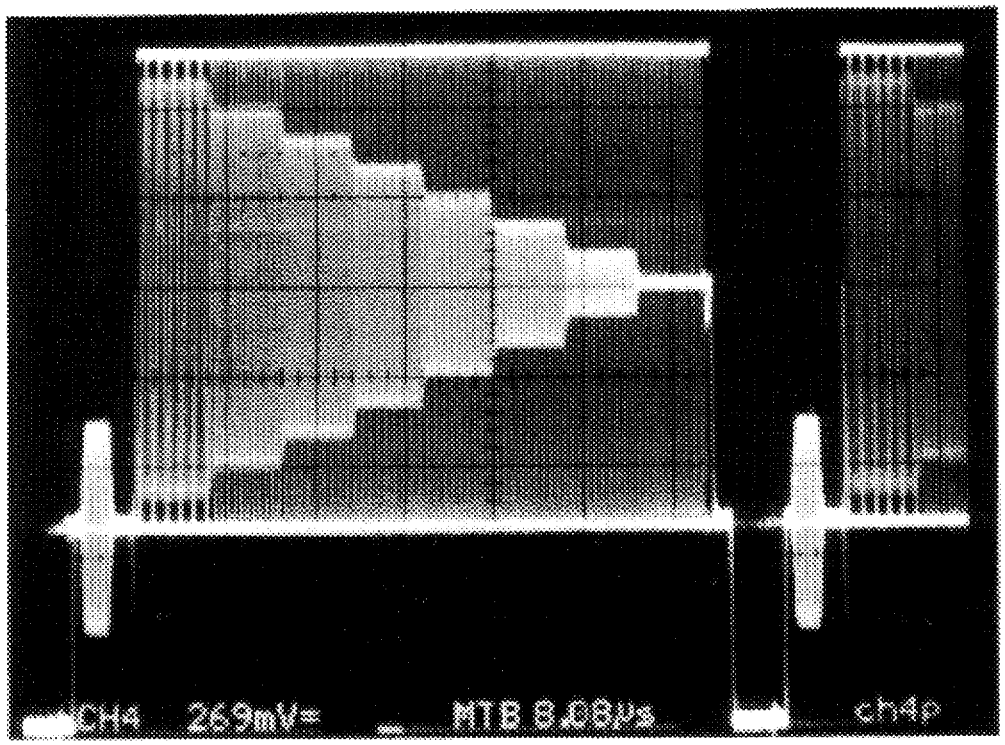
Figure 8C:
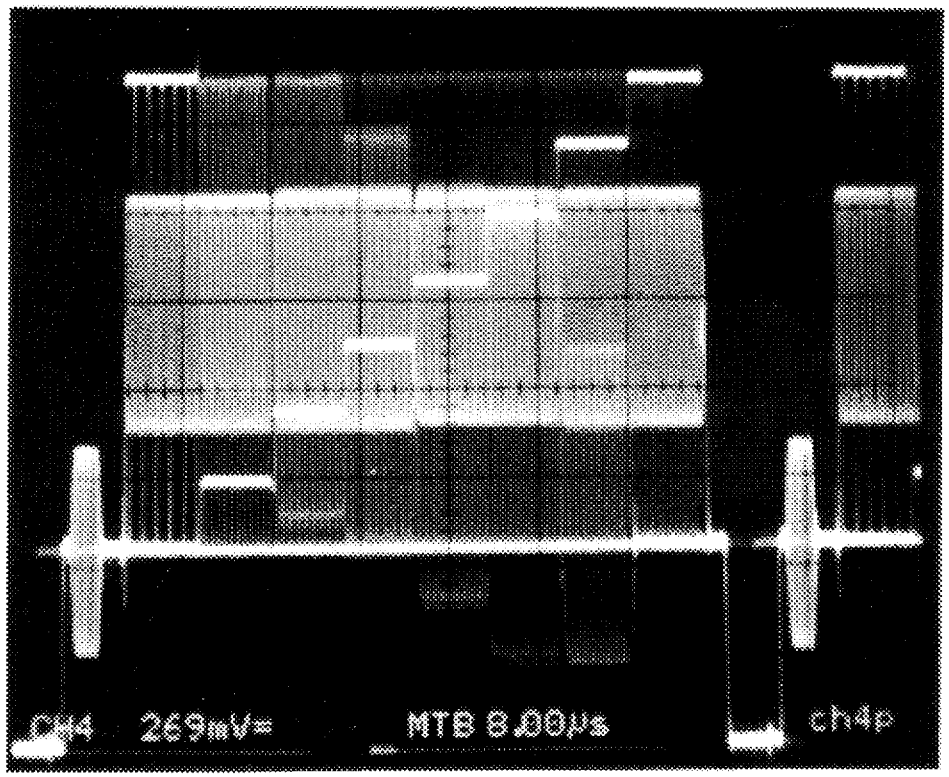
Figure 9A:
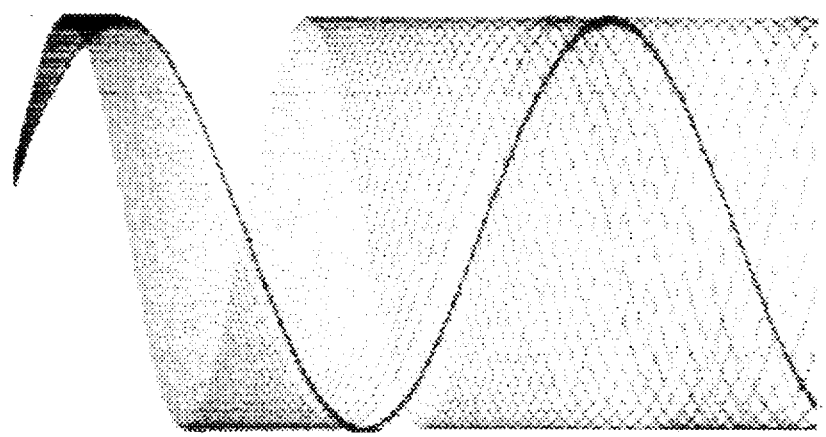
Figure 9B:
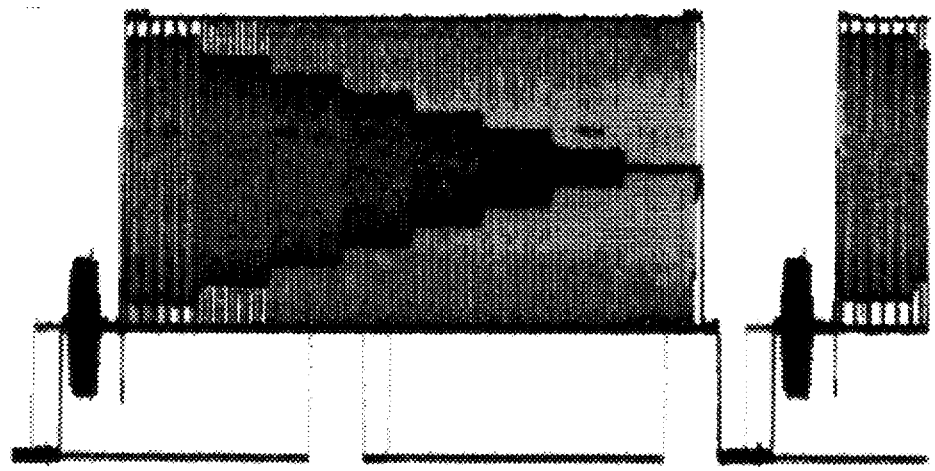
Figure 9C:
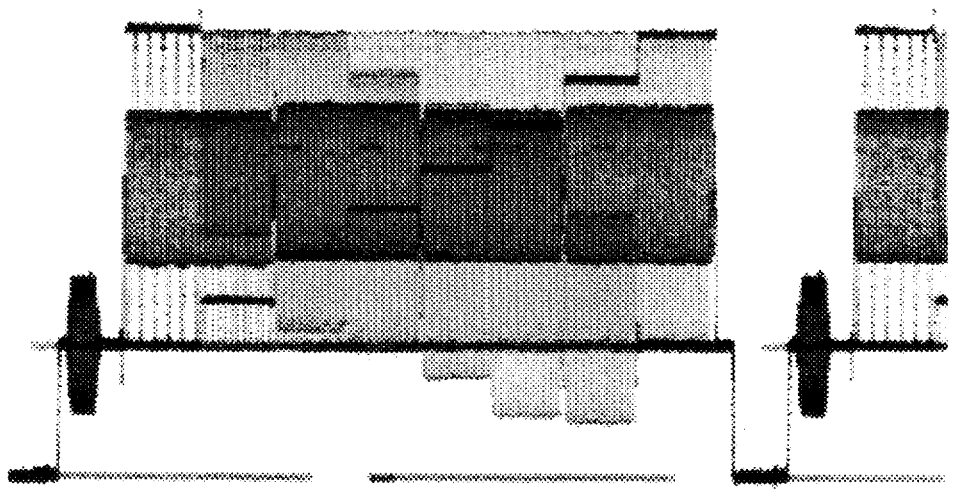
Figure 10:
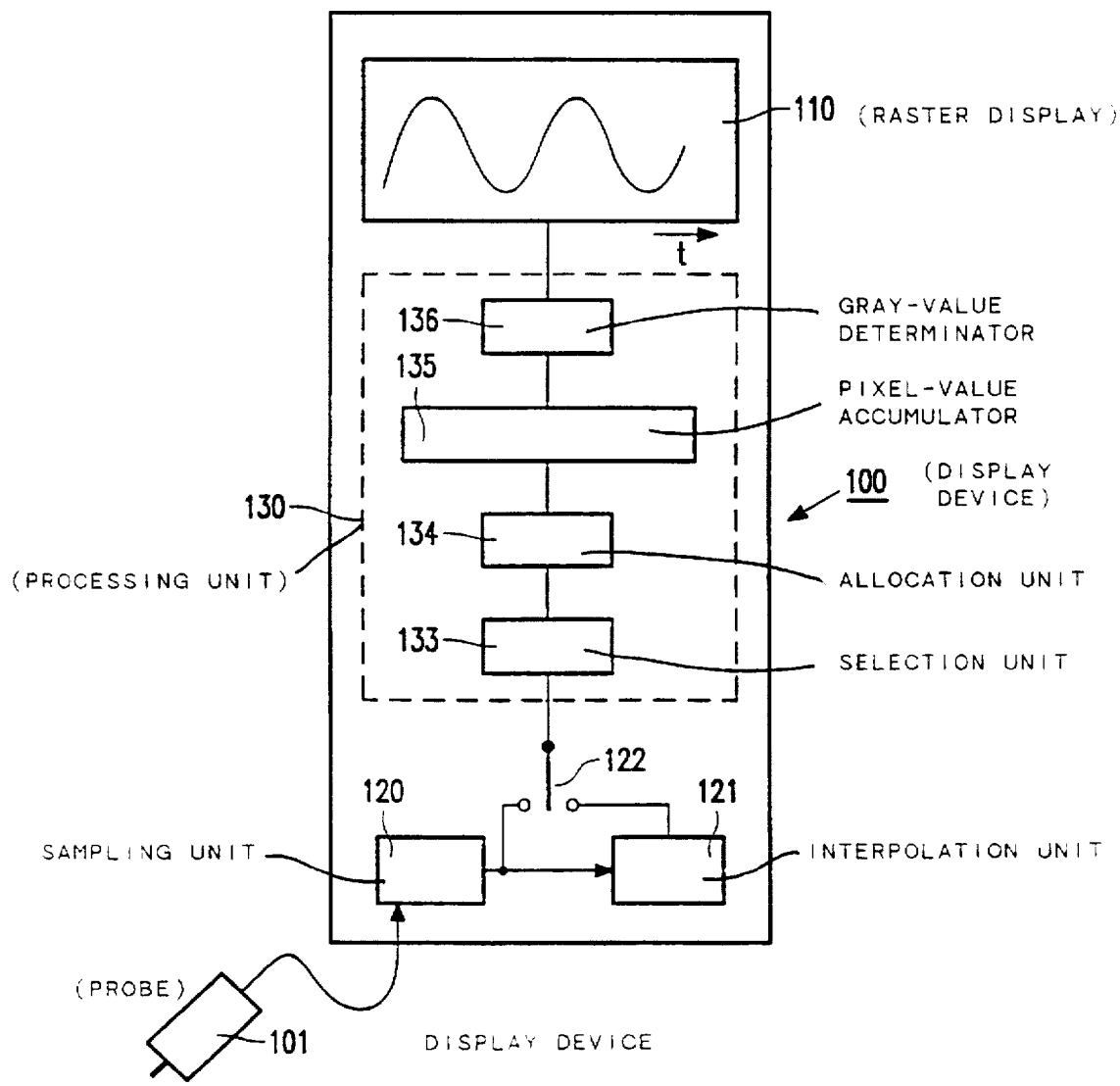

FIG. 1 an example of a periodic signal with a certain fine structure;

FIG. 2 a large number of periods of the same signal as it would be visible on an analogue display;

FIG. 3 a large number of periods of the same signal as it might be visible on a raster display with those pixels black in which at least one point falls and white without any point;

FIG. 4 the same signal of FIG. 3 as visible on a raster display with grey-values assigned to pixels as a function of the distance between the pixels and the points;

FIGS. 5a and 5b coordinate pairs of a number of points as distributed in the pixel space;

FIG. 6 a flow diagram of the probabilistic assignment scheme according to the invention;

FIG. 7 the signal of FIGS. 2, 3 and 4 as made visible on a raster display by means of the present invention;

FIGS. 8a, 8b and 8c examples of complex signal structures on an analogue display;

FIGS. 9a, 9b and 9c the structures of FIG. 8 as made visible on a raster display by use of the present invention; and FIG. 10 diagrammatically a device in accordance with the present invention.

FIG. 1 shows approximately two periods of a periodic signal 10. Each period can be considered as two adjacent sinelike waveforms 11 and 12. The first waveform 11 has a length $t_{11}$ and an amplitude $A_{11}$. This waveform is followed by a second waveform 12 with a much longer length $t_2$ and an amplitude $A_{12}$ about two times $A_{11}$. The second waveform deviates from the sinelike shape at both ends where the derivative vanishes. If a large number of periods of this signal 10 is displayed on an analogue display, it will be clear for the experienced observer that the signal comprises more components. As shown in FIG. 2, the display does not only show a band with a height of amplitude $A_{12}$ but within this band a narrower band with amplitude $A_{11}$ is visible and also a clear line in the middle which is caused by the portion of the second waveform 12 where the derivative is close to zero. It is possible to measure directly the amplitudes $A_{11}$ and $A_{12}$ on the display.

If such a signal with more detailed structure is sampled by a number of points and displayed on a raster display by a conventional method, it is necessary that the sampling rate be so high that a sufficient number of points is taken within an interval with length $t_{11}$ to make this detail visible. If this multitude of points is displayed in a conventional way, i.e. giving each pixel in which one or more points are located its maximum intensity, the result is a moire-like interference pattern between the raster of the display and the distribution of the points. A possible resulting beat pattern is shown in FIG. 3. It will be clear that even an experienced observer is unable to guess any details about the substructure of the sampled and displayed waveform.

In FIG. 4 an image of the same signal on a raster display is shown in which grey-values are allocated to pixels that are proportional to the pixel minus the distance from the pixel to the point. The moire-like pattern is reduced but still visible. Guessing any details of the substructure is still impossible.

FIGS. 5a and 5b show in a two dimensional representation the coordinate pairs of a number of sampled points on a curve. FIG. 5b is more detailed than FIG. 5a. The points are indicated by rectangular dots and together form a line 15. Indicated in the figures are also the edges 16, 17, 18 of columns k and k+1 and a number of rows of the pixel matrix. By a conventional representation of the points, each column would contain a continuous band of pixels that are "switched-on" (maximum intensity or black), indicated in the figure by the vertical bars 19 and 20. According to the invention the presence of a sample does not "switch on" the pixel in which it is located but adds an amount to the pixel-value of one or more pixels. Then the accumulated pixel-values are converted into grey-values. A pixel with more than one point contributing to it will have a higher pixel-value than a pixel with the contribution of only one point. Whether or not a point contributes to a pixel in a column and/or a row and with what amount is determined stochastically, the probability of contributing with a certain amount being dependent on the position of the point with respect to the pixel.

In a way of representing, for instance, a two-dimensional structure in time-amplitude space (t, A), the structure can first be supplemented with a third dimension representing the slope dA/dt (t, A, dA/dt). Subsequently, the three dimensional representation of the structure is converted into an array of points with x-y coordinate pairs and an amount to be added to pixel-values, the latter being a function of the slope. An amount proportional to $(1+\kappa(dA/dt)^2)^{-\frac{1}{2}}$ provides the same kind of intensity variation as occurs on an analogue oscilloscope, $\kappa$ being a suitable coefficient. If the points are calculated by means of interpolation between samples from a physical signal of structure, the value in the third dimension can be 1/(1+N), in which N is the number of points calculated between samples. This provides a similar intensity variation.

In a first embodiment, a point with a position $P_i$ in the horizontal direction contributes to a pixel with an amount of either $A_i$ or 0, the assignment being at random but with a certain probability. $A_i$ is the value of third coordinate of the point. The probability of contributing to the pixel in column k with the value $A_i$ is given by $\Pi_i = |1-(P_i-C_k)/(C_{k+1}-C_k)|$ if $C_k < P_i < C_{k+1}$, in which $C_k$ and $C_{k+1}$ are the left and right hand edges of column k. If in accordance with the random assignment procedure the point contributes with the amount 0 to the pixel in column k, the amount $A_i$ is added to the pixel-value of the pixel in the next, $(k+1)^{th}$, column. So, the probability of adding the amount $A_i$ to the next column is $\Pi'_i = 1 - \Pi_i$. Assigning the amount $A_i$ to one of the columns ascertains that the total contribution of each pixel is independent of the position of the point within the column. The effect is that points of which the position value is equal to the left hand edge of a column contribute with a probability equal one to a single pixel, and other points distribute their contribution in two adjacent pixels, effectively smearing out the contribution. This avoids sudden jumps or aliasing at column boundaries. An alternative is that the stochastic procedure for adding the amount $A_i$ to the pixel in column k or k+1 is independently executed for both pixels in accordance with probabilities $\Pi_i$ and $\Pi'_i = 1 - 529_i$.

Rather than with respect to the left hand edge of a column, the probability $529_i$ can equally well be calculated with respect to another position in the column, for example the centre. Further, a similar procedure can be used for sub-sets consisting of more pixels in more than two columns and/or in a two-dimensional situation, in which points do not only contribute to pixels in adjacent columns but also to pixels in adjacent rows. It is of course also possible to use another than a linear function for weight assignment.

The two variations of the stochastic assignment procedure are illustrated in FIG. 6 by means of a flow diagram. In the flow diagram path 1 designates the correlated assignment of the amount $A_i$ to the two pixels and path 2 the independent assignment. The use of this probabilistic assignment is advantageous in that it does not involve large numbers of floating point additions to keep track of the intermediate pixel values and the associated floating point arrays. When the number of samples per column is rather large the deviation between this preferred embodiment and the direct addition of weight values is minor.

In a variation of the method, more than two different weight values are possible and more than two pixels can have an increase in their pixel-values for each point. For, example, in a two-dimensional implementation, a point can contribute to each pixel out of a square or rectangular sub-matrix of pixels (2×2 or 2×3) around the point's position. In such a case it can be useful to contribute with amounts different from zero or full amount, such as to use two or three amounts that add up to the full amount $A_i$. In a further embodiment the linear probability function used for determining the chance of the contribution of a point to a pixel can be approximated by, for example, a step function. Such a step function may have the value 0.75 if $0 \leq (P_i - C_k)/(C_{k+1} - C_k) < 0.5$ and 0.25 if $0.5 \leq (P_i - C_k)/(C_{k+1} - C_k) < 1$. An alternative step function has the value 1 in the left hand quarter of the column, 0 in the right hand quarter and 0.5 in the centre half.

The number of points that can contribute to a pixel runs from zero to a very large number in case a structure or to be displayed comprises portions of different sub-structures. An amplitude modulated oscillating signal has many points with approximately the same value when the amplitude is low and has the points spread over a wide range when the amplitude is large. This results in a limited number of pixels with a large pixel-value and many pixels with moderate pixel-values. If in such a situation the grey-value assigned to each pixel of the raster display is proportional to the pixel-value and covering the whole range of intensities of the display, pixels with moderate pixel-values are not observable for the user. Alternatively, assigning different grey-values to the pixels with moderate pixel-values means that pixels with more than moderate pixels values will all receive the maximum intensity available in the display and no structure is visible any more.

In an embodiment of the invention this problem is addressed by using only four grey-values, having the values white, light-grey, dark-grey and black. White is used for zero intensity and black for maximum intensity. White is, for example, assigned to all pixels to which no points have contributed or all points contributed with an amount zero. Pixels having pixel-values unequal zero are classified as having low, intermediate or high intensity and are assigned grey-values of light-grey, dark-grey and black, respectively. The levels of pixel-values distinguishing between a low, intermediate and high grey-value can be set such that predetermined fractions fall into each of the classes. If the distribution of pixel-values is not known a priori, the levels can be adjusted in a stream of pixel-values by initially setting the levels at arbitrary values. Subsequently, the levels are adjusted in dependence of the pixel-values present in the stream. A procedure to this effect is described in the article by W. J. J. Rey: "Robust estimates of quantiles, location and scale in time series", published in Philips Research reports, Vol. 29, (1974), pages 67–92. Suitable levels for three different grey-values are lowest third, central third and highest third but other distributions are of course also possible. A limited number of different grey-values means that each pixel in the display can be stored with only a few bits. In case of three grey-values and zero, only two bits per pixel are required.

Results of the method according to the invention are shown in FIGS. 7, 8 and 9. FIG. 7 shows the signal of FIGS. 2, 3 and 4 as displayed by means of the stochastic procedure according to the invention. In comparison with FIG. 4, no moirepattern is visible and the image perceived by the observer is similar to the image as visible on an analogue display (FIG. 2). FIG. 8a, 8b and 8c show different signals on an analogue display. FIG. 8a contains a frequency sweep signal, FIG. 8b a VCR signal and FIG. 8c a complex TV test signal with many components. The latter two signals have components that occur subsequently in time but that are superposed in the displayed image. FIGS. 9a, 9b and 9c show the same signals on a raster display by means of the method according to the present invention. No moire- or beat patterns can be seen and the various signal components are visible sufficiently clear for allowing measurements.

In FIG. 10 a device in accordance with the present invention is represented diagrammatically. The display device 100 comprises a raster display 110, for example a LCD, for display of a structure. The structure may be derived from an image picked-up by an image sensor or generated by a computer or obtained in another way. In this example it is assumed that structure is the value of a time varying electric signal, available to the display device via a probe 101. From the time varying electric signal a series of sampled points is derived in the sampling unit 120. The coordinates of the points are sample-time and signal values. The number of points to be displayed over the width of the raster display will be much larger than the number of columns in the display. For this purpose, an interpolation unit 121 can be used to generate interpolated points if the number of sampled points is insufficient to provide several points for each column. By means of a switch 122 interpolation can be switched on or off.

Conversion of the series of sampled and/or interpolated points to grey-values for the raster display occurs in the processing unit 130. For each point a sub-set of pixels is determined in the selection unit 133. The sub-set comprises those pixels to which the point may contribute on basis of its coordinates. In displaying a time varying signal this will normally be a few (two) pixels in the same row but in adjacent columns of the pixel-matrix. In allocation unit 134 one of the pixels of the sub-set is selected by means of a stochastic selection. The probability to select a pixel is chosen to depend on the position of the point with respect to a reference in the sub-set. The pixel-value accumulator 135 comprises a number of registers in which the contributed amounts of each of the pixels are added. The values in the registers are displayed on the raster display after conversion into a limited number of grey-values in grey-value determinator 136. Somewhere in the processing of the points a transformation of the coordinates has to be made from the signal-value and time to a frame of reference of the pixel-matrix. This transformation can occur on various points and is not indicated in the figure.

The various elements of the processing unit can be implemented in software, by means of a programmed microprocessor and a connected memory. In a preferred embodiment the processing unit 130 is realised in hardware in a dedicated semiconductor circuit, for example an ASIC or a field programmable device. In the latter implementation timing requirements can be better met.

We claim:

1. Method for displaying on a raster display a plurality of points, each described by a pair of coordinates, said raster display comprising a pixel-matrix of a number of rows and a number of columns, in which method for each pixel a respective grey-value is determined that is derived from the position of the points relative to the pixel, characterised in that the array is displayed on such a scale that several points may fall within the same pixel;

that for each pixel a pixel-value is calculated from contributions of the points by first determining on basis of the coordinates of each point a sub-set of the pixels and subsequently adding an amount to the pixel-value of one or more pixels from said sub-set in accordance with a stochastic procedure;

and that the respective grey-values are derived from the calculated pixel-values.

2. Method according to claim 1, characterised in that the amount with which a point adds to a pixel-value is selected from a set of predetermined amounts.

3. Method according to claim 2, characterised in that in said stochastic procedure a probability is determined for selecting an amount from said set of predetermined amounts, said probability being derived from the difference between the point's coordinates and the position of the pixel in the pixel-matrix after transformation into a common frame of reference.

4. Method according to claim 2, characterised in that for each point the set of predetermined amounts comprises two values being zero and a full amount value, the latter being a function of said point.

5. Method according to claim 1, characterised in that the number of different grey-values is limited, that to each pixel a grey-value is assigned on basis of the determined pixel-value and that each of said grey-values is assigned in an approximately constant fraction of the pixel-values in a stream of pixel-values building up the pixel-matrix.

6. Method according to claim 5, characterised in that said limited number of grey-values is four, one of the grey-values designating a lowest level, and in that the three other grey-values are assigned in approximately equal fractions in the stream of pixel-values.

7. Method according to claim 1, characterised in that the array of points is derived by sampling the value of a quantity that evolves as a function of a unidirectional parameter and/or by interpolation, which sampling and/or interpolation provides a plurality of points that is a multitude of the number of rows or columns in the display within a range of the coordinate covered by the number of rows or columns.

8. Display device having a display comprising a raster with a pixel-matrix of a number of rows and a number of columns, and a processing unit for assigning to pixels of the pixel-matrix grey-values in accordance with a plurality of points described by respective pairs of coordinates, said processing unit comprising
- a pixel selection unit for selecting for each point with coordinates within a display range a sub-set of pixels of the pixel matrix;
- an allocation unit for determining by means of a stochastic procedure to which of the respective pixels in said sub-set an amount will be allocated;
- a pixel-value accumulator for accumulating for each pixel the amounts contributing to said pixel thereby forming accumulated pixel-values; and
- a grey-value determinator for determining a grey-value from said accumulated pixel-values.

9. Display device according to claim 8, wherein the processing unit comprises a memory and a processor containing a program and said pixel selection unit, said allocation unit, said pixel-value accumulator and said grey-value determinator are realised by means of said program present in said processor.

10. Display device according to claim 8, further comprising a signal probe coupled to a signal sampling unit for generating sampled points from a signal with a time varying value available via said signal probe, the coordinates of said sampled points being the value of the signal and the sample time and wherein an input of the pixel selection unit is coupled to an output of the signal sampling unit for receiving said sampled points.

11. Semiconductor device for use in a display device as claimed in claim 8, comprising a processing unit for assigning to the pixels of a pixel-matrix grey-values in accordance with a plurality of points described by respective pairs of coordinates, the processing unit comprising
- a pixel selection unit for selecting for each point with coordinates within a range a sub-set of pixels of the pixel matrix;
- an allocation unit for determining by means of a stochastic procedure to which of the respective pixels in said sub-set an amount will be allocated;
- a pixel-value accumulator for accumulating for each pixel the amounts contributing to said pixel thereby forming accumulated pixel-values; and
- a grey-value determinator for determining a grey-value from said accumulated pixel-values.

* * * * *